(12) United States Patent
Jeong et al.

(10) Patent No.: US 8,059,460 B2
(45) Date of Patent: Nov. 15, 2011

(54) METHOD OF PROGRAMMING NONVOLATILE MEMORY DEVICE

(75) Inventors: Byoung Kwan Jeong, Jeollabuk-do (KR); Chul Woo Yang, Gyeonggi-do (KR); Mi Sun Yoon, Jeollabuk-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 77 days.

(21) Appl. No.: 12/650,608

(22) Filed: Dec. 31, 2009

(65) Prior Publication Data

US 2010/0195401 A1 Aug. 5, 2010

(30) Foreign Application Priority Data

Feb. 2, 2009 (KR) .................. 10-2009-0008066

(51) Int. Cl.
*G11C 16/06* (2006.01)
(52) U.S. Cl. ......... 365/185.09; 365/185.22; 365/185.12; 365/185.19
(58) Field of Classification Search ............. 365/185.09, 365/185.22, 185.12, 185.19
See application file for complete search history.

(56) References Cited

U.S. PATENT DOCUMENTS

2003/0145176 A1* 7/2003 Dvir et al. .............. 711/154

FOREIGN PATENT DOCUMENTS

| KR | 100673704 | 1/2007 |
| KR | 1020080030216 | 4/2008 |

OTHER PUBLICATIONS

Notice of Allowance issued from Korean Intellectual Property Office on Feb. 24, 2011.

* cited by examiner

*Primary Examiner* — Thong Q Le
(74) *Attorney, Agent, or Firm* — IP & T Group LLP

(57) ABSTRACT

A method of programming a nonvolatile memory device includes an inputting step for inputting program data to a first latch of each of page buffers, and inputting redundancy data to a second latch of each of the page buffers, a verification result storage step for performing a program operation on selected memory cells using the program data stored in the first latch, performing a verification operation for the program operation, and storing a result of the verification operation in the first latch of each of the page buffers coupled with the selected memory cells, a verification result change step for changing the result stored in the first latch using the redundancy data stored in the second latch, and a verification check step for determining whether all data stored in the second latches, after the verification result change step, are program pass data.

9 Claims, 5 Drawing Sheets

METHOD OF PROGRAMMING NONVOLATILE MEMORY DEVICE

CROSS-REFERENCE TO RELATED APPLICATION

Priority to Korean patent application number 10-2009-0008066 filed on Feb. 2, 2009, the entire disclosure of which is incorporated by reference herein, is claimed.

BACKGROUND

One or more embodiments relate to the operations of a nonvolatile memory device and, more particularly, to a method of programming a nonvolatile memory device, which is capable of solving a problem in that verification results are erroneously recognized because of errors of a page buffer.

A nonvolatile memory device has the advantages of random access memory (RAM), which enables the writing and erasure of data, and read only memory (ROM), which retains data even without the supply of power. Thus, nonvolatile memory devices have recently been widely used for the storage media of electronic devices, such as digital cameras, personal digital assistant (PDAs), and MP3 players.

The conventional nonvolatile memory device includes a memory cell array, a row decoder, a page buffer unit, etc. The memory cell array includes a plurality of word lines extending in rows, a plurality of bit lines extending in columns, and a plurality of cell strings corresponding to the respective bit lines.

In the case where a fail memory cell is detected, a repair method of replacing the fail memory cell with a redundant memory cell is used in order to improve the yield of nonvolatile memory devices.

When an address signal is received, the redundancy sense circuit of the nonvolatile memory device detects the address signal, and outputs a repair control signal indicative of whether a repair operation has to be performed. The redundancy sense circuit stores repair address information programmed by a fuse element.

The repair operation is performed on a column basis, and a fail column is replaced with a redundancy column. The data of a page buffer coupled to the fail column is set such that the page buffer is in a pass state when a program operation is performed.

FIG. 1 is a flowchart illustrating the program operation of a conventional nonvolatile memory device.

Referring to FIG. 1, a program command and program data are received at steps S101 and S103, respectively. The nonvolatile memory device resets a count value to '0' at step S105, and performs a program operation at step S107 in order to limit the number of times program pulses are applied.

After the program operation is performed, the nonvolatile memory device increases the count value by one at step S109, and performs a program verification operation at step S111. Next, the nonvolatile memory device checks a verification state and a latch in which a result of the program verification operation is stored at step S113. The verification state is a data signal outputted in response to a verification signal of the page buffer.

It is then determined whether the program operation is a pass for all the memory cells at step S115. If, as a result of the determination, the program operation is determined to be a pass for all the memory cells, the nonvolatile memory device sets a program state to 'pass' at step S117 and finishes the program operation at step S119.

However, if, as a result of the determination at step S115, the program operation is determined not to be a pass for all the memory cells, the nonvolatile memory device determines whether the count value has reached a maximum critical value MAX at step S121. If, as a result of the determination at step S121, the count value is determined not to have reached the maximum critical value MAX, the nonvolatile memory device returns to step S107 in which a program voltage is raised and the program operation is performed again.

However, if, as a result of the determination at step S121, the count value is determined to have reached the maximum critical value MAX, the nonvolatile memory device sets the state data to 'fail' at step S122 and finishes the program operation at step S119.

If data has normally been programmed into a repaired column when the above operation is performed, program pass data is stored in the latch of a page buffer coupled to the repaired column. However, if the page buffer coupled to the fail column does not normally operate, the program pass data is not stored in the page buffer coupled to the fail column.

Accordingly, a problem may arise because, even though a program operation has normally been performed, the program operation is recognized as having not been completed, thereby setting state data to 'fail'.

BRIEF SUMMARY

One or more embodiments relate to a method of programming a nonvolatile memory device, which is capable of finishing a normal program operation by solving the problem that a state data 'fail' is generated because of errors of a page buffer.

A method of programming a nonvolatile memory device according to an aspect of this disclosure includes an inputting step of inputting program data to a first latch of each of page buffers, and inputting redundancy data to a second latch of each of the page buffers, a verification result storage step of performing a program operation on selected memory cells using the program data stored in the first latch, performing a verification operation for the program operation, and storing a result of the verification operation in the first latch of each of the page buffers coupled with the selected memory cells, a verification result change step of changing the result stored in the first latch using the redundancy data stored in the second latch, and a verification check step of determining whether all data stored in the second latches, after the verification result change step, are program pass data.

The method further includes a program frequency check step of counting a number of times that the program operation has been performed, if not all pieces of data stored in the second latches after the verification result change step are determined to be program pass data, and a set fail step of setting state data to 'fail' and finishing the program operation, when the number of times that the program operation has been performed is a set value or more.

The method further includes a repeating step of repeating the verification result storage step, the program frequency check step, the verification result change step, and the verification check step when the number of times that the program operation has been performed is not the set value or more, wherein each time the program operation is performed the program operation uses a program voltage that is changed according to an increment step pulse program (ISPP) method.

The method further includes a set pass step of setting a state data to 'pass' and finishing the program operation, if all the data stored in all the page buffers, after the verification result change step, are determined to be program pass data.

A method of programming a nonvolatile memory device according to another aspect of this disclosure includes performing a program operation and a verification operation for the program operation, loading redundancy data, if a program pass is not obtained as a result of performing a predetermined number of the program and verification operations, setting first data to page buffers coupled with a fail bit line using the redundancy data, determining whether all the program operations are a pass by checking whether all data stored in the page buffers are the first data, and setting a state data to 'fail' and finishing the program operation, if one of the program operations is determined not to be a pass.

Loading the redundancy data includes resetting an additional latch other than latches for storing program data, from among the page buffers, and inputting the first data to the additional latch.

The inputting of the first data to the additional latch includes, inputting the first data to a page buffer coupled with a redundant memory cell, when a repair control signal is received.

The method further includes setting the state data to 'pass' and finishing the program operations, if all the program operations are determined to be a pass.

The method further includes providing a program voltage that is raised by a step voltage, before performing the program operation additional times.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
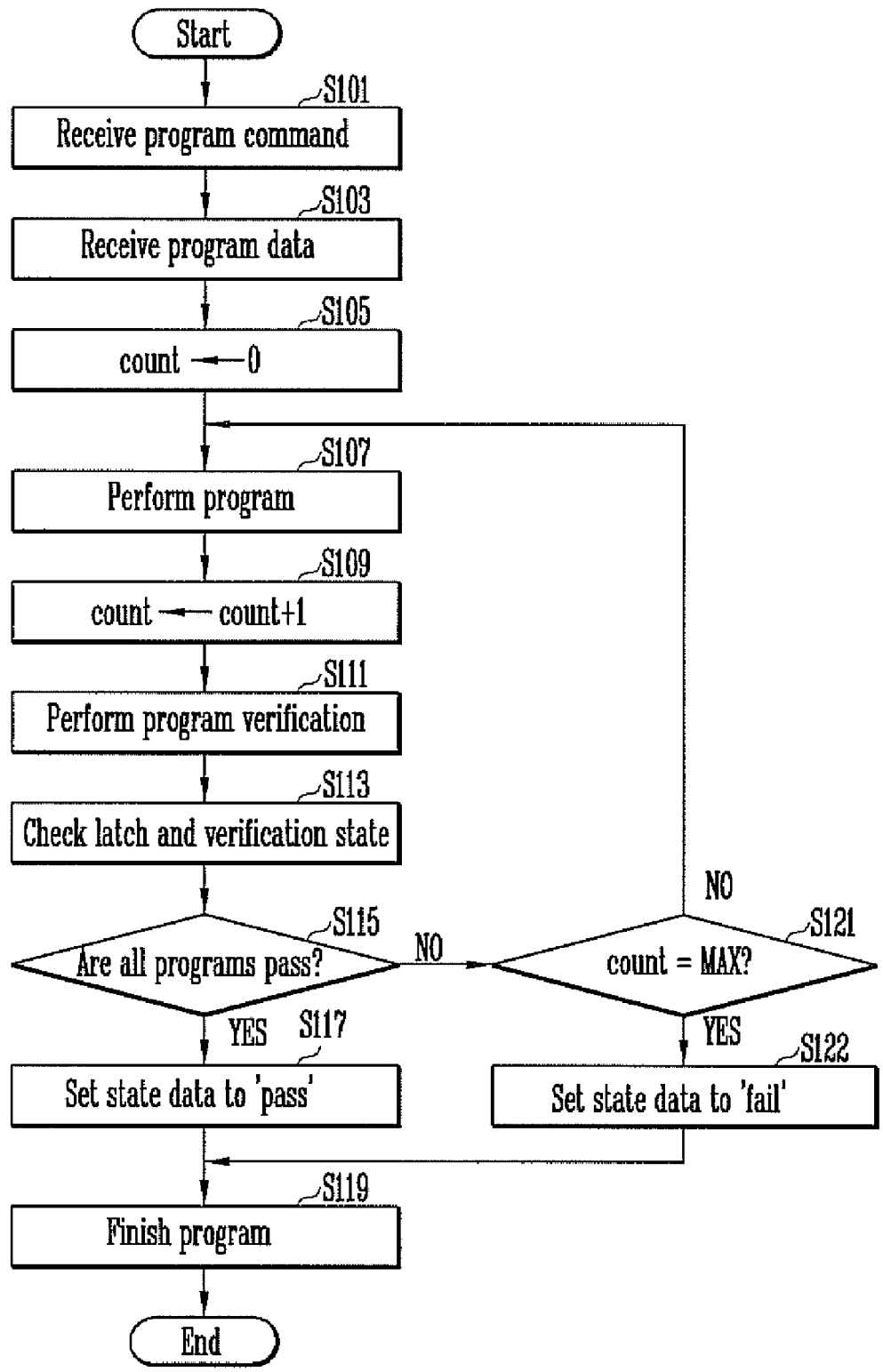
FIG. 1 is a flowchart illustrating the program operation of a conventional nonvolatile memory device.
Figure 2A:
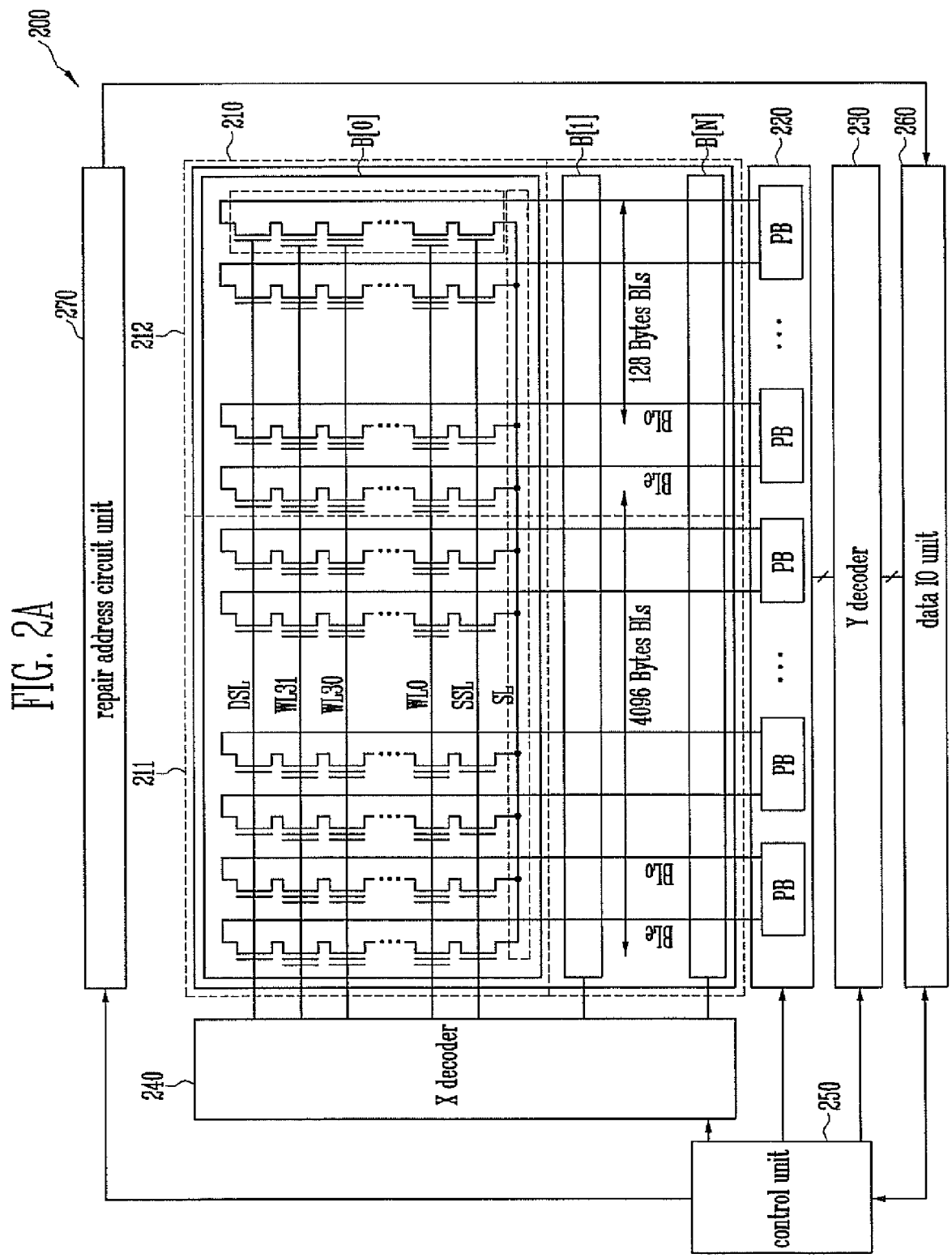
FIG. 2A is a diagram showing a nonvolatile memory device according to an embodiment of this disclosure.

FIG. 2A is a diagram showing a nonvolatile memory device according to an embodiment of this disclosure.

Referring to FIG. 2A, the nonvolatile memory device 200 includes a memory cell array 210, a page buffer unit 220, a Y decoder 230, an X decoder 240, a control unit 250, a data IO unit 260, and a repair address circuit unit 270.

The memory cell array 210 includes memory cells for storing data, and the memory cells are coupled together by word lines WL and bit lines. Furthermore, the memory cells are classified into memory groups B[0] to B[N], and are operated on a memory-block basis.

The memory cell array 210 can be classified into a main memory cell unit 211 and a redundant memory cell unit 212. The main memory cell unit 211 includes memory cells configured to store program data. The redundant memory cell unit 212 includes memory cells configured to replace fail memory cells which are included in the bit lines (or columns), but not used by the main memory cell unit 211.

If there is no fail memory cell in the main memory cell unit 211, the redundant memory cell unit 212 may not be used. However, if the main memory cell unit 211 includes a fail memory cell included in a bit line, the corresponding bit line is substituted with a bit line of the redundant memory cell unit 212. Accordingly, the main memory cell unit 211 and the redundant memory cell unit 212 have the same structure, and differ only in their use.

The page buffer unit 220 includes page buffers PB each coupled to one or more bit lines. In the embodiment of this disclosure, a single page buffer PB is coupled to a pair of an even bit line BLe and an odd bit line BLo.

In both the main memory cell unit 211 and the redundant memory cell unit 212, a pair of the bit lines is also coupled to a single page buffer PB, and each page buffer PB has the same circuit.

Each of the page buffers PB is configured to latch program data in a memory cell, coupled to a bit line selected from among bit lines coupled thereto, or to read data programmed into a memory cell and store the read data.

The Y decoder 230 is configured to provide a data IO path to the page buffers PB, and the data IO unit 260 is responsible for data IO between the nonvolatile memory device 200 and the outside. Furthermore, the data IO unit 260 is configured to transfer input commands and addresses to the control unit 250 and to transfer program data to the Y decoder 230 or output data, outputted from the Y decoder 230, to the outside.

Here, the data IO unit 260 is configured to select the main memory cell unit 211 or the redundant memory cell unit 212 in response to a repair control signal received from the repair address circuit unit 270, and to input or output data.

The X decoder 240 is configured to select and enable a memory block and to couple a global word line to which operating voltages are inputted. The repair address circuit unit 270 is configured to compare an address for a program operation or a read operation and a previously stored address on which a repair operation has been performed, and to output the repair control signal, indicating whether the repair operation has been performed, to the data IO unit 260.

The control unit 250 is configured to control the operations of the X decoder 240, the page buffer unit 220, the Y decoder 230, and so on in response to a command received from the data IO unit 260.

The page buffer PB is constructed as follows.

Figure 2B:
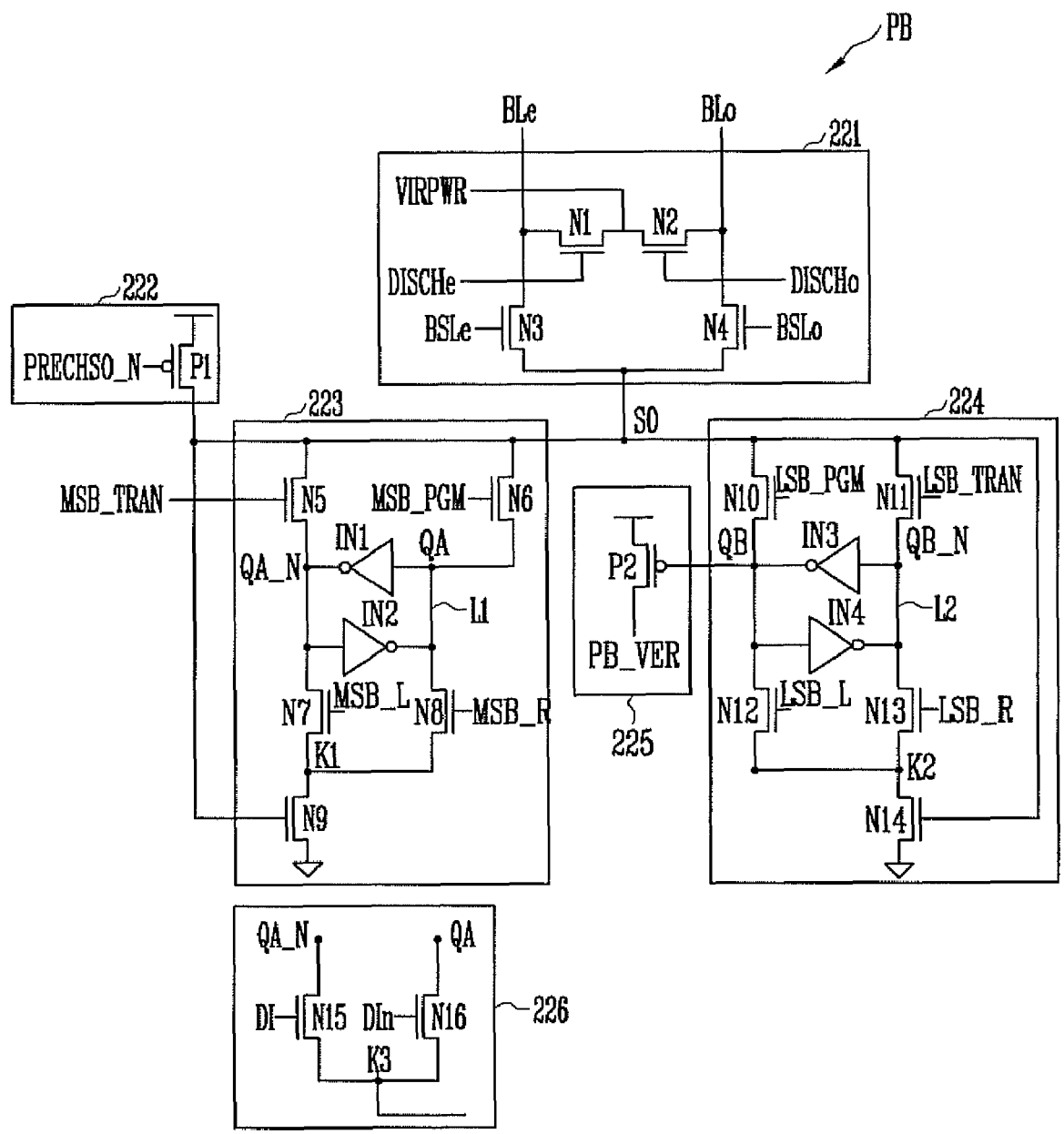
FIG. 2B is a circuit diagram of a page buffer shown in FIG. 2A.

FIG. 2B is a circuit diagram of a page buffer PB shown in FIG. 2A.

Referring to FIG. 2B, the page buffer PB includes a bit line selection unit 221, a precharge unit 222, first and second latch units 223, 224, a verification unit 225, and a data input unit 226.

The bit line selection unit 221 is configured to select the even bit line BLe or the odd bit line BLo and to couple a selected bit line to a sense node SO. The precharge unit 222 is configured to precharge the sense node SO.

The first and second latch units 223, 224 each are configured to include a latch circuit for storing data, such as program data and read data.

The verification unit 225 is coupled to the latch node QB of the second latch unit 224 and is configured to output a verification signal PB_VER according to a state of the latch node QB.

The data input unit 226 is configured to input program data to the first latch unit 223.

The circuit of the page buffer PB includes first to sixteenth NMOS transistors N1 to N16, first to fourth inverters IN1 to IN4, and first and second PMOS transistors P1, P2.

The first and second NMOS transistors N1,N2 are coupled in series between the even bit line BLe and the odd bit line BLo, and a shared node of the first and second NMOS transistors N1, N2 is supplied with a virtual voltage VIRPWR.

Furthermore, an even discharge control signal DISCHe is inputted to the gate of the first NMOS transistor N1, and an odd discharge control signal DISCHo is inputted to the gate of the second NMOS transistor N2.

The third NMOS transistor N3 is coupled between the even bit line BLe and the sense node SO, and the fourth NMOS transistor N4 is coupled between the odd bit line BLo and the sense node SO.

An even bit line selection signal BSLe is inputted to the gate of the third NMOS transistor N3, and an odd bit line selection signal BSLo is inputted to the gate of the fourth NMOS transistor N4.

A first PMOS transistor P1 is coupled between a power supply voltage and the sense node SO, and a precharge control signal PRECHSO_N is inputted to the gate of the first PMOS transistor P1.

The fifth NMOS transistor N5 is coupled between the sense node SO and a node QA_N, and the sixth NMOS transistor N6 is coupled between the sense node SO and a node QA. A most significant bit (MSB) transmission signal MSB_TRAN is inputted to the gate of the fifth NMOS transistor N5, and an MSB program signal MSB_PGM is inputted to the gate of the sixth NMOS transistor N6.

The first and second inverters IN1, IN2 are coupled to form a first latch L1 between the node QA_N and the node QA.

The seventh NMOS transistor N7 is coupled between the node QA_N and a node K1, and the eighth NMOS transistor N8 is coupled between the node QA and the node K1. A first MSB latch signal MSB_L is inputted to the gate of the seventh NMOS transistor N7, and a second MSB latch signal MSB_R is inputted to the gate of the eighth NMOS transistor N8.

The ninth NMOS transistor N9 is coupled between the node K1 and a ground node, and the gate of the ninth NMOS transistor N9 is coupled to the sense node SO. The ninth NMOS transistor N9 performs a data sense function of sensing a voltage level of the sense node SO and coupling the node K1 to the ground node.

The tenth NMOS transistor N10 is coupled between the sense node SO and the node QB, and the eleventh NMOS transistor N11 is coupled between the sense node SO and a node QB_N. A least significant bit (LSB) program signal LSB_PGM is inputted to the gate of the tenth NMOS transistor N10, and an LSB transmission signal LSB_TRAN is inputted to the gate of the eleventh NMOS transistor N11.

The third and fourth inverters IN3, IN4 are coupled by a second latch L2 between the node QB and the node QB_N.

The twelfth NMOS transistor N12 is coupled between the node QB and a node K2, and the thirteenth NMOS transistor N13 is coupled between the node QB_N and the node K2. A first LSB latch signal LSB_L is inputted to the gate of the twelfth NMOS transistor N12, and a second LSB latch signal LSB_R is inputted to the gate of the thirteenth NMOS transistor N13.

The fourteenth NMOS transistor N14 is coupled between the node K2 and a ground node, and the gate of the fourteenth NMOS transistor N14 is coupled to the sense node SO. In a similar way to the ninth NMOS transistor N9, the fourteenth NMOS transistor N14 performs a data sense function of coupling the node K2 to the ground node according to a voltage level of the sense node SO.

A second PMOS transistor P2 is coupled between the power supply voltage and the output terminal of the verification unit 225 for outputting the verification signal PB_VER, and the gate of the second PMOS transistor P2 is coupled to the node QB.

The fifteenth NMOS transistor N15 is coupled between the node QA_N and a node K3, and the sixteenth NMOS transistor N16 is coupled between the node QA and the node K3. A data input signal DI is inputted to the gate of the fifteenth NMOS transistor N15, and an inverse data input signal DIn is inputted to the gate of the sixteenth NMOS transistor N16. The inverse data input signal Din is an inverted signal of the data input signal DI.

The node K3 is coupled to a data line.

The first latch unit 223 of the page buffer PB according to the embodiment of this disclosure is configured to receive and store external program data, and the second latch unit 224 is configured to receive the program data from the first latch unit 223 and store a verification state after a program operation is performed.

The operation of the page buffer PB is described in short below.

In the embodiment of this disclosure, it is assumed that a memory cell coupled to the even bit line BLe is programmed. Furthermore, it is assumed that when '0' is received, a program operation is performed, and when '1' is received, the program operation is inhibited.

In the case where program data is '0', in order to input the data, a data line is coupled to the ground node. When a data input signal DI of a high level is received, the node K3 and the node QA_N are coupled together, and therefore, the node QA_N is coupled to the ground node.

Accordingly, the state '0' is inputted to the node QA.

The state '0' inputted to the node QA is transferred to the node QB of the second latch unit 224. To this end, the precharge control signal PRECHSO_N of a low level is inputted to precharge the sense node SO to a high level.

Next, the MSB transmission signal MSB_TRAN of a high level is inputted, and so the fifth NMOS transistor N5 is turned on. When the fifth NMOS transistor N5 is turned on, the sense node SO remains in a high level in response to the state '1' latched in the node QA_N.

When the sense node SO is in a high level, the fourteenth NMOS transistor N14 is turned on, and so the node K2 is coupled with the ground node. Next, when the first LSB latch signal LSB_L of a high level is inputted, the state '0' is inputted to the node QB.

The state '0' inputted to the node QB is programmed into a selected memory cell coupled with the even bit line BLe. Next, a program verification operation for verifying a program result is performed. The program operation is the same as that of a conventional nonvolatile memory device, and a detailed description thereof is omitted.

In the program verification operation, first, the sense node SO is precharged with a high level. The even bit line selection signal BSLe of a first voltage (V1) level is applied, and so the even bit line BLe is precharged. Next, the even bit line selection signal BSLe shifts to a low level, and so the third NMOS transistor N3 is turned off.

Next, an evaluation period in which a read voltage Vread is applied to the word line of the selected memory cell and a pass voltage Vpass is applied to the remaining word lines is performed.

During the evaluation period, if the program operation has been performed such that the selected memory cell has a threshold voltage more than the read voltage Vread, the even bit line BLe maintains the precharged voltage without change. However, if the program operation has not yet been performed such that the selected memory cell has a threshold voltage more than the read voltage Vread, the even bit line BLe is discharged.

After the evaluation period, the even bit line selection signal BSLe of a second voltage (V2) level is applied. Here, the sense node SO has been precharged with a high level.

If the even bit line BLe maintains the precharge state, and thus, has a voltage more than the second voltage V2, the third NMOS transistor N3 is not turned on. Furthermore, if the even bit line BLe is discharged, and thus, has a voltage less than the second voltage V2, the third NMOS transistor N3 is turned on. When the third NMOS transistor N3 is turned on, the voltage of the sense node SO is discharged.

That is, if the selected memory cell has been programmed, the sense node SO maintains a high level. If the selected memory cell has not yet been programmed, the sense node SO becomes a low level.

If the selected memory cell has been programmed, the fourteenth NMOS transistor N14 is turned on by the sense node SO of a high level, and the node K2 is coupled with the ground node. Next, when the second LSB latch signal LSB_R of a high level is applied, the node QB_N shifts to a low level, and the node QB shifts to a high level.

On the contrary, if the selected memory cell has not yet been programmed, the data of the second latch L2 is not affected because the sense node SO is in a low level.

Consequently, when the node QB shifts to '1', a corresponding bit line is program-inhibited in relation to subsequent program pulses, and so further program operations are not performed.

The page buffer PB, as described above, is coupled with a pair of the bit lines.

Accordingly, to check whether a program operation for all memory cells has been completed when performing one page program, the verification signal PB_VER outputted from the verification unit 225 of each page buffer PB is used.

In the state in which a program operation has not yet been completed, the node QB maintains state '0'. Accordingly, the second PMOS transistor P2 remains turned on, and the verification signal PB_VER of a high level is received.

However, if the program operation is completed, the node QB changes to state '1', and the second PMOS transistor P2 is turned off. Thus, the verification signal PB_VER of a high level is no longer outputted, and the output terminal of the verification signal PB_VER becomes a floating state.

When the second PMOS transistor P2 of the verification unit 225 of each of all the page buffers PB of the page buffer unit 220 is turned off, it is determined that a program operation for all memory cells belonging to a corresponding page has been completed. Accordingly, a next page is programmed, or the program operation is finished.

Accordingly, in the case where a bit line includes a fail memory cell and the fail bit line is substituted with a bit line of the redundant memory cell unit 212, a program verification operation can normally be completed only when the node QB of the second latch L2 of a page buffer PB coupled with the fail bit line is set to '1'. Here, if the page buffer PB coupled with the fail bit line does not normally operate, and thus, the node QB is not set to '1', a state data of 'fail' is set because the program operation is not normally verified. To prevent this problem, a masking method of changing the node QB of a fail page buffer PB into '1' is used before a program operation is performed. However, even though the masking method is used, if the node QB of the page buffer PB undesirably changes to state '0' during a program operation, the state data 'fail' is inevitably set.

To solve the problem, the program method according to the embodiment of this disclosure can be performed as follows.

Figure 3:
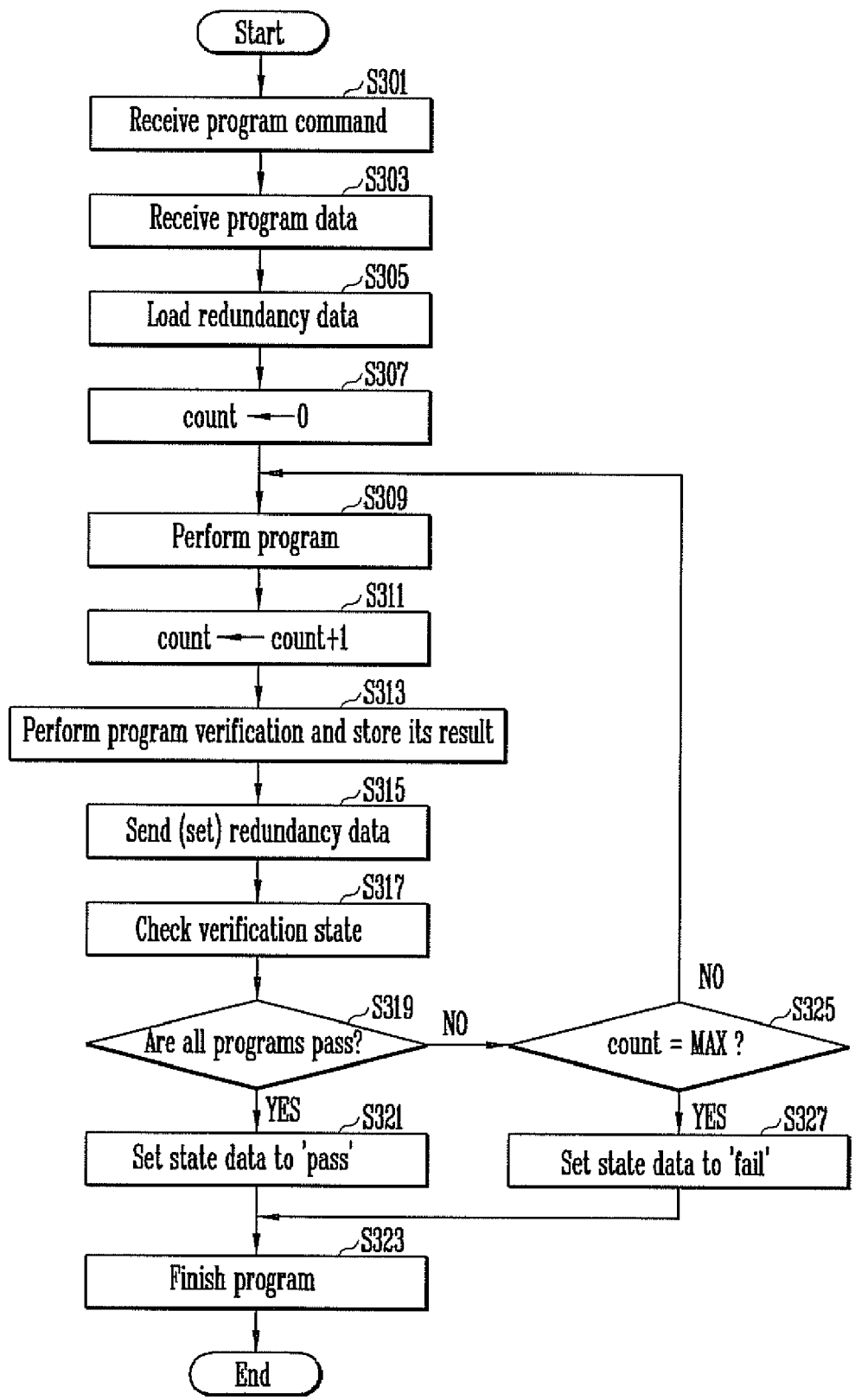
FIG. 3 is a flowchart illustrating a method of programming a nonvolatile memory device according to a first embodiment of this disclosure.

FIG. 3 is a flowchart illustrating a method of programming a nonvolatile memory device according to a first embodiment of this disclosure.

Referring to FIG. 3, a program command and program data are received at steps S301 and S303. Redundancy data (i.e., repaired bit line address information) is loaded and stored in a page buffer PB at step S305.

To this end, the nodes QA, QB_N of the first and second latches L1, L2, respectively, of the page buffer PB are reset to state '1'. Next, the program data is inputted to the node QA of the first latch L1.

The program data is inputted through the data unit 260. In response to the repair control signal outputted from the repair address circuit unit 270, the Y decoder 230 transfers the inputted data to a page buffer PB coupled with the main memory cell unit 211 or a page buffer PB coupled with the redundant memory cell unit 212. In the case where a program operation has to be performed, '0' is inputted, and in the case where a program operation is not performed, '1' is inputted.

The program data, stored in the first latch L1, is transferred to the node QB of the second latch L2.

Next, the redundancy data is inputted. To this end, the data IO unit 260 resets the node QA of the first latch L1 of the corresponding page buffer PB to '1' and inputs '0' to all the remaining page buffers PB.

Here, when the repair control signal is received, the Y decoder 260 inputs '0' to the page buffer PB coupled with the redundant memory cell unit 212, as opposed to the page buffer PB coupled with the main memory cell unit 211. Accordingly, the node QA of a page buffer PB with which a repaired bit line is coupled in the main memory cell unit 211 maintains state '1' that was set upon reset, and the nodes QA of a page buffer PB coupled with an unrepaired bit line and of a page buffer PB coupled with the redundant memory cell unit 212 become '0'.

Although the page buffer PB according to the embodiment of this disclosure is illustrated to include only the first and second latches L1, L2, the number of latches may be increased according to the design of a circuit.

Next, a count value for counting a number of program pulses applied to perform a program operation is reset to '0' at step S307, and the corresponding program operation is performed at step S309. In the program operation, the program data, stored in the node QB of the second latch L2, is programmed.

After the program operation is performed, the count value is increased by one at step S311. Next, a program verification operation is performed, and a result of the program verification operation is stored in the node QB of the page buffer PB at step S313.

Next, to transmit the redundancy data, the data stored in the node QA of the first latch L1 is transferred to the node QB of the second latch L2 at step S315.

It is then determined whether the program verification operation is a 'pass' for all the memory cells by checking a verification state ('0' or '1') indicated by the verification signal PB_VER at steps S317 and/or S319.

Here, when the redundancy data is transmitted, the state of the second latch L2 is not changed with the node QA set to '0', but the state of the node QB of the second latch L2 changes to '1' with the node QA set to '1'. Accordingly, although the node QB of a page buffer PB coupled with a repaired column erroneously shifts to '0', the node QB changes to '1' again. Consequently, the page buffer PB coupled with the repaired column normally shifts to '1', and therefore, the coupled repaired column does not have an effect on a program verification operation.

Regarding the verification state, an additional verification check circuit is used. The verification check circuit is used to output a state indicative of verification completion when the state of each of the nodes QB of all page buffers PB is '1', and the output terminal of the verification unit 225 for outputting the verification signal PB_VER is floated. The verification check circuit is known in the art, and a description thereof is omitted.

If, as a result of the determination at steps S317 and/or S319, the program verification operation is determined to be a 'pass' for all the memory cells, a state data is set to 'pass' at step S321, and the program operation is finished at step S323.

However, if, as a result of the determination at steps S317 and/or S319, the program verification operation is determined not to be a 'pass' for all the memory cells, it is determined whether a current count value is a maximum value at step S325.

If, as a result of the determination at step S325, the current count value is determined to be the maximum value, the state data is set to 'fail' at step S327, and the program operation is finished at step S323.

However, if, as a result of the determination at step S325, the current count value is determined not to be the maximum value, the process returns to step S309 in which the program operation is performed again. Here, when performing the program operation again, a program voltage is raised according to an increment step pulse program (ISPP) method.

Instead of using the method of setting a page buffer PB based on redundancy information in each program verification operation as described above, the following method of setting a page buffer PB only when a count value is a maximum value can be used.

Figure 4:
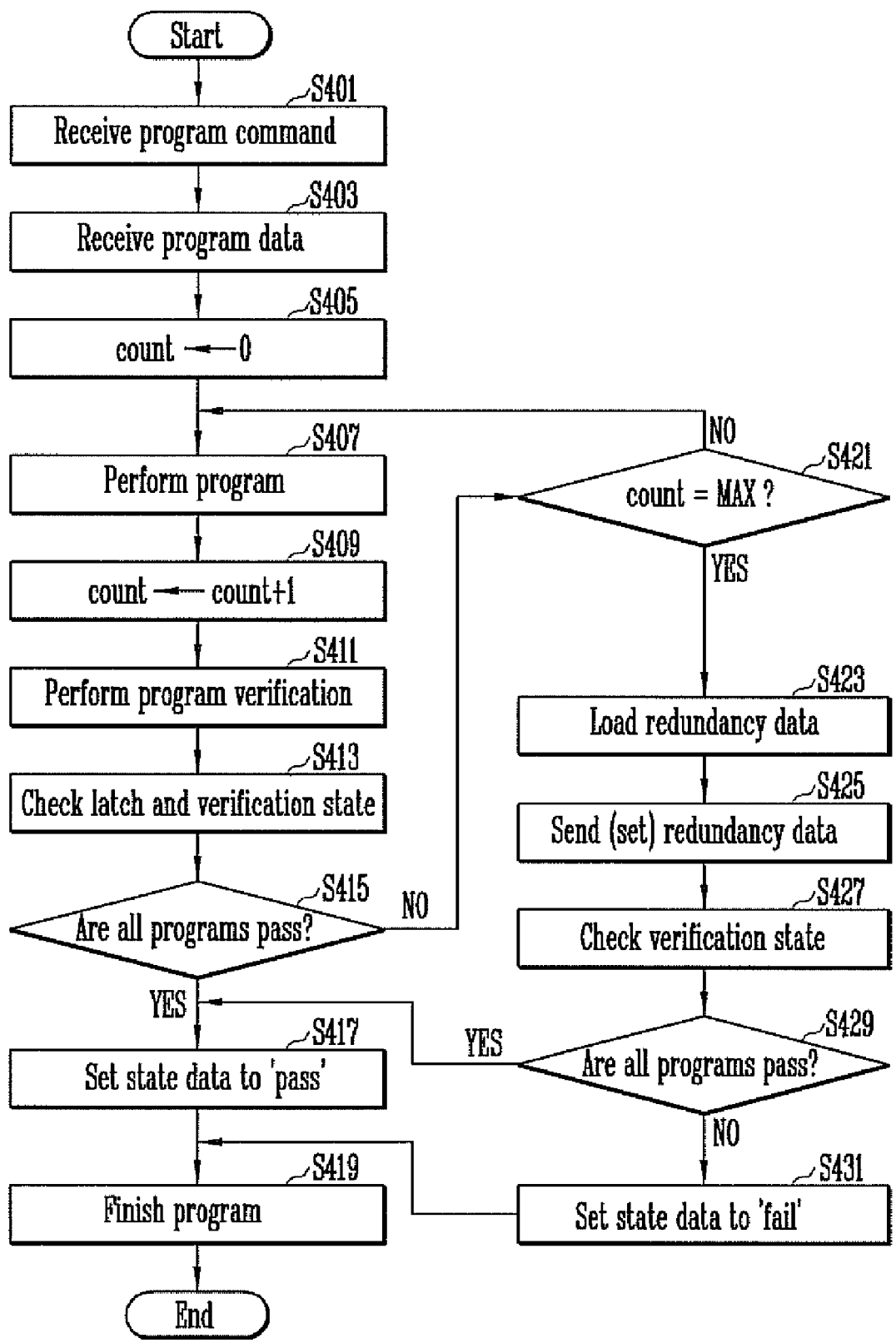
FIG. 4 is a flowchart illustrating a method of programming a nonvolatile memory device according to a second embodiment of this disclosure.

FIG. 4 is a flowchart illustrating a method of programming a nonvolatile memory device according to a second embodiment of this disclosure.

Referring to FIG. 4, a program command and program data are received at steps S401 and S403. Here, address information on which a program operation has to be performed is also received.

To perform the program operation, a count value for counting a number of program pulses is set to '0' at step S405, and the program operation is performed according to the program pulse at step S407. After the program operation is performed, the count value is increased by one at step S409.

Next, a program verification operation is performed at step S411, and the node QB of the second latch L2 of a corresponding page buffer PB and a verification state are checked at step S413.

It is then determined whether all the memory cells of the corresponding page buffer PB are a 'pass' based on the verification state at step S415. If, as a result of the determination at step S415, all the memory cells are determined to be a 'pass,' a state data is set to 'pass' at step S417, and the program operation is finished at step S419.

However, if, as a result of the determination at step S415, it is determined that all the memory cells are not a pass, it is determined whether a current count value is a maximum value at step S421. If, as a result of the determination at step S421, the current count value is determined not to be the maximum value, the process returns to step S407 in which the program operation is performed again. Here, a program voltage is increased by a step voltage according to the ISPP method.

However, if, as a result of the determination at step S421, the current count value is determined to be the maximum value, the control unit 250 loads redundancy data at step S423. Here, as in the first embodiment, in loading the redundancy data, the state of the node QA of the first latch L1 is reset to '1'. Thereafter, when '0' is received through the data IO unit 260, the Y decoder 230 changes the state of the node QA to '0' in response to the repair control signal such that '1' is maintained only in the node QA of a page buffer PB coupled with a repaired bit line. Next, the data of the node QA is transferred to the node QB, thereby setting the corresponding page buffer PB using the redundancy data at step S425.

After the setting of the redundancy data, it is determined whether the program operation for all the memory cells of the corresponding page buffer PB is a pass by checking the verification state at step S427 and/or S429. In the case where program operations for the remaining page buffers, other than the page buffer PB coupled with a fail bit line, are a 'pass,' it is determined that the program operation for all the memory cells is a 'pass' because the state data of the page buffer PB coupled with the fail bit line has also been set to 'pass' at step S425.

Accordingly, if, as a result of the determination at steps S427 and/or S429, all the memory cells of the corresponding page buffer PB are determined to be a program pass, the process returns to step S417 in which the state data is set to a 'pass', and the program operation is finished at step S419.

However, if, as a result of the determination at steps S427 and/or S429, it is determined that all the memory cells of the corresponding page buffer PB are not a program pass, it means that the remaining page buffers PB, other than the page buffer PB coupled with the fail bit line, are not a 'pass.' Thus, the state data is set to 'fail' at step S431, and the program operation is finished at step S419.

According to the first and second embodiments of this disclosure, even in the case where the state of a corresponding page buffer is arbitrarily changed during a program operation, a normal program operation can be performed by setting pass data to a corresponding page buffer using redundancy data.

As described above, pass data is stored in a page buffer coupled with a repaired column. Accordingly, a normal program operation can be completed without influencing a program verification operation.

What is claimed is:

1. A method of programming a nonvolatile memory device, comprising:
   an inputting step of inputting program data to a first latch of each of page buffers, and inputting redundancy data to a second latch of each of the page buffers;
   a verification result storage step of performing a program operation on selected memory cells using the program data stored in the first latch, performing a verification operation for the program operation, and storing a result of the verification operation in the first latch of each of the page buffers coupled with the selected memory cells;
   a verification result change step of changing the result stored in the first latch using the redundancy data stored in the second latch; and
   a verification check step of determining whether all data stored in the first latches, after the verification result change step, are program pass data.

2. The method of claim 1, further comprising:
   a program frequency check step of counting a number of times that the program operation has been performed, if not all data stored in the second latches after the verification result change step are determined to be program pass data; and a set fail step of setting state data to 'fail' and finishing the program operation, when the number of times that the program operation has been performed is a set value or more.

3. The method of claim 2, further comprising:
a repeating step of repeating the verification result storage step, the program frequency check step, the verification result change step, and the verification check step when the number of times that the program operation has been performed is not the set value or more, wherein each time the program operation is performed the program operation uses a program voltage that is changed according to an increment step pulse program (ISPP) method.

4. The method of claim 1, further comprising:
a set pass step of setting a state data to 'pass' and finishing the program operation, if all the data stored in all the page buffers, after the verification result change step, are determined to be program pass data.

5. A method of programming a nonvolatile memory device, comprising:
performing a program operation and a verification operation for the program operation;
loading redundancy data, if a program pass is not obtained as a result of performing a predetermined number of the program and verification operations;
setting first data to page buffers coupled with a fail bit line using the redundancy data;
determining whether all the program operations are a pass by checking whether all data stored in the page buffers are the first data; and
setting a state data to 'fail' and finishing the program operation, if one of the program operations is determined not to be a pass.

6. The method of claim 5, wherein the loading of the redundancy data comprises:
resetting an additional latch other than latches for storing program data, from among the page buffers; and
inputting the first data to the additional latch.

7. The method of claim 6, wherein the inputting of the first data to the additional latch comprises, inputting the first data to a page buffer coupled with a redundant memory cell, when a repair control signal is received.

8. The method of claim 7, further comprising, setting the state data to 'pass' and finishing the program operations, if all the program operations are determined to be a pass.

9. The method of claim 5, further comprising, providing a program voltage that is raised by a step voltage, before performing the program operation additional times.

* * * * *